(12) United States Patent
Toshikiyo et al.

(10) Patent No.: US 8,759,931 B2
(45) Date of Patent: Jun. 24, 2014

(54) SOLID-STATE IMAGING DEVICE

(71) Applicant: Panasonic Corporation, Osaka (JP)

(72) Inventors: Kimiaki Toshikiyo, Osaka (JP); Keijirou Itakura, Osaka (JP)

(73) Assignee: Panasonic Corporation, Osaka (JP)

( * ) Notice: Subject to any disclaimer, the term of this patent is extended or adjusted under 35 U.S.C. 154(b) by 21 days.

(21) Appl. No.: 13/716,264

(22) Filed: Dec. 17, 2012

(65) Prior Publication Data
US 2013/0099343 A1     Apr. 25, 2013

Related U.S. Application Data

(63) Continuation of application No. PCT/JP2011/003626, filed on Jun. 24, 2011.

(30) Foreign Application Priority Data

Jul. 2, 2010 (JP) ................................ 2010-152528

(51) Int. Cl.
*H01L 31/0232* (2014.01)
*H01L 27/146* (2006.01)

(52) U.S. Cl.
CPC ..... *H01L 31/02327* (2013.01); *H01L 27/14625* (2013.01)
USPC ...................... 257/432; 257/E31.127; 438/65

(58) Field of Classification Search
CPC ................... H01L 27/14625; H01L 27/14643; H01L 31/02327
USPC .............................. 257/432, E31.127; 438/65
See application file for complete search history.

(56) References Cited

U.S. PATENT DOCUMENTS

| | | | |
|---|---|---|---|
| 4,363,963 A | 12/1982 | Ando | |
| 5,485,015 A * | 1/1996 | Choi | ............................... 257/21 |
| 7,732,813 B2 | 6/2010 | Park | |
| 8,018,508 B2 | 9/2011 | Toshikiyo | |
| 8,076,745 B2 | 12/2011 | Nishiwaki | |

(Continued)

FOREIGN PATENT DOCUMENTS

| | | |
|---|---|---|
| JP | 55-120182 | 9/1980 |
| JP | 2008-192771 | 8/2008 |

(Continued)

OTHER PUBLICATIONS

International Search Report issued Sep. 13, 2011 in International (PCT) Application No. PCT/JP2011/003626.

*Primary Examiner* — Allan R Wilson
(74) *Attorney, Agent, or Firm* — Wenderoth, Lind & Ponack, LLP.

(57) ABSTRACT

A solid-state imaging device includes: a plurality of pixel cells; and column signal lines. Each of the pixel cells includes: a photoelectric conversion film, a pixel electrode, a transparent electrode, an amplifier transistor, a reset transistor, and an address transistor. The solid-state imaging device further includes: a lower-refractive-index transparent layer formed above the transparent electrode; and higher-refractive-index transparent parts embedded in the lower-refractive-index transparent layer and each having a refractive index higher than a refractive index of the lower-refractive-index transparent layer. Each of the higher-refractive-index transparent parts separates light passing through the higher-refractive-index transparent part into zero-order diffracted light, first-order diffracted light, and negative-first-order diffracted light which exit the higher-refractive-index transparent part and travel toward the photoelectric conversion film.

12 Claims, 20 Drawing Sheets

(56) References Cited

U.S. PATENT DOCUMENTS

| | | | |
|---|---|---|---|
| 8,259,201 B2* | 9/2012 | Stuck et al. | 348/273 |
| 2003/0086649 A1* | 5/2003 | Zhou | 385/37 |
| 2007/0045760 A1* | 3/2007 | Ihama | 257/431 |
| 2007/0146531 A1 | 6/2007 | Toshikiyo | |
| 2008/0185500 A1 | 8/2008 | Toshikiyo | |
| 2008/0224137 A1 | 9/2008 | Park | |
| 2008/0308149 A1* | 12/2008 | Nomura et al. | 136/256 |
| 2010/0165134 A1* | 7/2010 | Dowski et al. | 348/218.1 |
| 2010/0176473 A1 | 7/2010 | Nishiwaki | |
| 2010/0214432 A1* | 8/2010 | Nakata et al. | 348/222.1 |
| 2010/0244169 A1* | 9/2010 | Maeda et al. | 257/432 |
| 2011/0164156 A1* | 7/2011 | Hiramoto et al. | 348/272 |
| 2011/0176044 A1 | 7/2011 | Toshikiyo | |
| 2011/0192962 A1 | 8/2011 | Nishiwaki et al. | |
| 2012/0018758 A1* | 1/2012 | Matioli et al. | 257/98 |

FOREIGN PATENT DOCUMENTS

| | | |
|---|---|---|
| JP | 2008-227448 | 9/2008 |
| JP | 4264465 | 5/2009 |
| JP | 2010-067829 | 3/2010 |
| WO | 2005/101067 | 10/2005 |
| WO | 2009/019818 | 2/2009 |
| WO | 2010/016195 | 2/2010 |

* cited by examiner

SOLID-STATE IMAGING DEVICE

CROSS REFERENCE TO RELATED APPLICATIONS

This is a continuation application of PCT International Application No. PCT/JP2011/003626 filed on Jun. 24, 2011, designating the United States of America, which is based on and claims priority of Japanese Patent Application No. 2010-152528 filed on Jul. 2, 2010. The entire disclosures of the above-identified applications, including the specifications, drawings and claims are incorporated herein by reference in their entirety.

FIELD

The present invention relates to solid-state imaging devices, and particularly to a layered solid-state imaging device.

BACKGROUND

A typical solid-state imaging device is configured to include photodiodes embedded in a light-receiving part.

Patent Literature 1 discloses what is called a layered solid-state imaging device which has control electrodes included in a solid-state amplifier device, a photoelectric conversion layer formed on the control electrodes, and a transparent electrode layer provided on the photoelectric conversion layer so as to convert a light signal into an electric signal at a favorable signal-to-noise ratio by allowing voltage applied to the transparent electrode layer to affect the control electrodes through the photoelectric conversion layer.

CITATION LIST

Patent Literature

[Patent Literature 1] Japanese Unexamined Patent Application Publication No. 55-120182

SUMMARY

Technical Problem

The layered solid-state imaging device has a configuration in which pixel circuitry is formed in a semiconductor substrate and a photoelectric conversion film is provided, via an insulating film, above the semiconductor substrate. Due to the configuration of the layered solid-state imaging device, it is possible to use a material having a large optical absorption coefficient, such as amorphous silicon, for the photoelectric conversion film. For example, most of green light having a wavelength of 550 nm is absorbed as it passes through a photoelectric conversion film including amorphous silicon and having a thickness of 0.4 nm.

Furthermore, since the layered solid-state imaging device in the configuration does not include embedded photodiodes, the photoelectric conversion part can have an increased capacitance, and the saturated charge amount of the solid-state imaging device is thereby increased. Furthermore, it is possible to further increase the capacitance because part of electric charges is not transferred. This allows miniaturized pixel cells to have a sufficient capacitance and have a structure similar to the structure of a stacked cell in a dynamic random access memory.

However, when the solid-state imaging device disclosed in Patent Literature 1 include general pigment-based color filters to separate light passing therethrough into light having different colors, the solid-state imaging device has a loss in an incident signal because light in colors other than a desired color is absorbed as passing through the color filters. Accordingly, the solid-state imaging device disclosed in Patent Literature 1 has a trade-off problem between color reproducibility and sensitivity.

Conceived to address the problem, the present invention has an object of providing a solid-state imaging device having high color reproducibility and high sensitivity.

Solution to Problem

In order to achieve the object, a solid-state imaging device according to an aspect of the present invention includes: pixel cells arranged in rows and columns; and column signal lines each of which is provided for a corresponding one of the columns and transmits signal voltages of the pixel cells in the corresponding column, the pixel cells each including: a photoelectric conversion film which is formed above a semiconductor substrate and converts incident light into electric charges; a pixel electrode which is formed on one surface of the photoelectric conversion film and is in contact with the photoelectric conversion film, the one surface facing the semiconductor substrate; a transparent electrode which is formed on the other surface of the photoelectric conversion film and applies a constant voltage to the photoelectric conversion film, the other surface being an opposite surface to the one surface facing the semiconductor substrate; an amplifier transistor which is a transistor formed in the semiconductor substrate, has a gate electrode connected to the pixel electrode, and outputs a signal voltage depending on a potential of the pixel electrode; a reset transistor which is a transistor formed in the semiconductor substrate and resets a potential of the gate electrode of the amplifier transistor; and an address transistor which is a transistor formed in the semiconductor substrate, is provided between the amplifier transistor and the column signal line, and causes the pixel cell to output the signal voltage to the column signal line, and the solid-state imaging device further including: a lower-refractive-index transparent layer formed above the transparent electrode; and a plurality of higher-refractive-index transparent parts embedded in the lower-refractive-index transparent layer and each having a refractive index higher than a refractive index of the lower-refractive-index transparent layer, wherein each of the higher-refractive-index transparent parts separates light passing through the higher-refractive-index transparent part into zero-order diffracted light, first-order diffracted light, and negative-first-order diffracted light which exit the higher-refractive-index transparent part and travel toward the photoelectric conversion film.

In the solid-state imaging device according to the present aspect, light passing a dispersive element is separated into light of different color components by the dispersive element, and the light of each color component is directed to the photoelectric conversion film included in a different pixel cell. It is therefore possible to reduce light volume loss due to absorption in color separation relative to general pigment-based color filters. As a result, the solid-state imaging device has high color reproducibility and high sensitivity.

Furthermore, the solid-state imaging device is a layered solid-state imaging device, in which no wiring is formed above the photoelectric conversion part. It is therefore possible to avoid a situation in which light traveling obliquely from the dispersive element to a light entrance surface is blocked by wiring. As a result, the solid-state imaging device has higher sensitivity.

Advantageous Effects

The solid-state imaging device according to an aspect of the present invention has a structure in which layers are stacked and includes dispersive elements, so that the solid-state imaging device has both high resolution and increased sensitivity. This will contribute to increase of performance and reduction of prices of products which include image sensors, such as digital video cameras, digital still cameras, camera-equipped mobile phones, surveillance cameras, in-car cameras, and broadcast cameras.

BRIEF DESCRIPTION OF DRAWINGS

These and other objects, advantages and features of the invention will become apparent from the following description thereof taken in conjunction with the accompanying drawings that illustrate a specific embodiment of the present invention.

Figure 9:
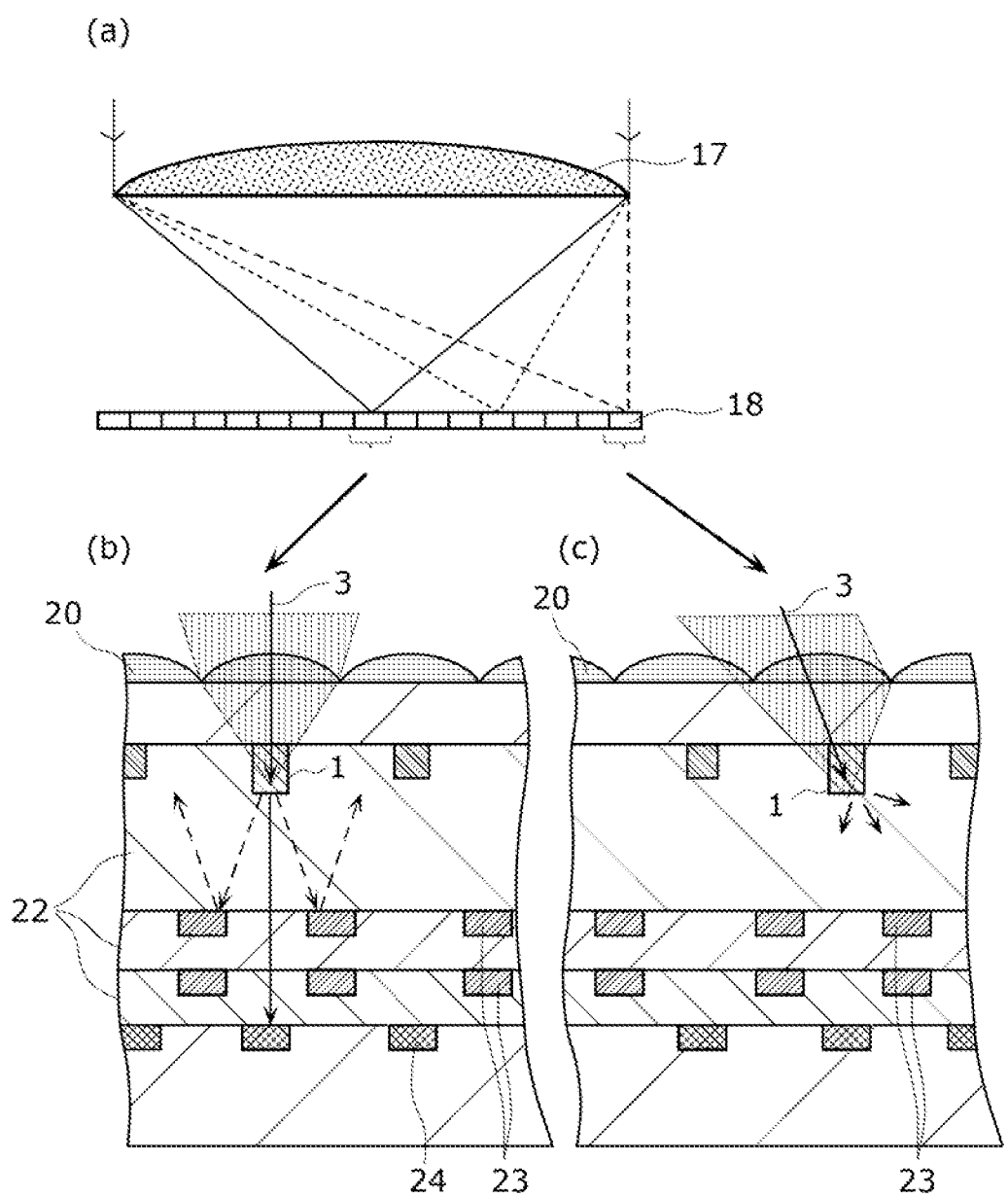

(a) in FIG. 9 is a sectional view of a camera system according to the comparative example of the embodiments of the present invention, (b) and (c) in FIG. 9 are sectional views of a solid-state imaging device according to the comparative example of the embodiments of the present invention.

DESCRIPTION OF EMBODIMENTS

In order to achieve the object, provided is a solid-state imaging device according to an aspect of the present invention includes: pixel cells arranged in rows and columns; and column signal lines each of which is provided for a corresponding one of the columns and transmits signal voltages of the pixel cells in the corresponding column, the pixel cells each including: a photoelectric conversion film which is formed above a semiconductor substrate and converts incident light into electric charges; a pixel electrode which is formed on one surface of the photoelectric conversion film and is in contact with the photoelectric conversion film, the one surface facing the semiconductor substrate; a transparent electrode which is formed on the other surface of the photoelectric conversion film and applies a constant voltage to the photoelectric conversion film, the other surface being an opposite surface to the one surface facing the semiconductor substrate; an amplifier transistor which is a transistor formed in the semiconductor substrate, has a gate electrode connected to the pixel electrode, and outputs a signal voltage depending on a potential of the pixel electrode; a reset transistor which is a transistor formed in the semiconductor substrate and resets a potential of the gate electrode of the amplifier transistor; and an address transistor which is a transistor formed in the semiconductor substrate, is provided between the amplifier transistor and the column signal line, and causes the pixel cell to output the signal voltage to the column signal line, and the solid-state imaging device further including: a lower-refractive-index transparent layer formed above the transparent electrode; and a plurality of higher-refractive-index transparent parts embedded in the lower-refractive-index transparent layer and each having a refractive index higher than a refractive index of the lower-refractive-index transparent layer, wherein each of the higher-refractive-index transparent parts separates light passing through the higher-refractive-index transparent part into zero-order diffracted light, first-order diffracted light, and negative-first-order diffracted light which exit the higher-refractive-index transparent part and travel toward the photoelectric conversion film.

The plurality of higher-refractive-index transparent parts includes a higher-refractive-index transparent part for red, a higher-refractive-index transparent part for green, and a higher-refractive-index transparent part for blue which differ from each other at least in refractive index, shape, and size. The phase shift between light transmitted by the lower-refractive-index transparent layer and light transmitted by each of the higher-refractive-index transparent parts is expressed as follows (a, b, and c are integers greater than or equal to zero): the higher-refractive-index transparent part for red, $(a+½)\times$ wavelength of red light; the higher-refractive-index transparent part for green, $(b+½)\times$wavelength of green light; and higher-refractive-index transparent part for blue, $(c+½)\times$ wavelength of blue light.

The plurality of higher-refractive-index transparent parts includes a first higher-refractive-index transparent part for a first wavelength and a second higher-refractive-index transparent part for a second wavelength. The thicknesses h of these higher-refractive-index transparent parts are expressed as follows (a and b are integers greater than or equal to zero, n denotes a refractive index of the higher-refractive-index transparent part, and n1 denotes a refractive index of the lower-refractive-index transparent layer): the first higher-refractive-index transparent part, $h=\text{first wavelength}\times(2\times a+1)/\{2\times(n-n0)\}$; and second higher-refractive-index transparent part, $h=\text{second wavelength}\times(2\times b+1)/\{2\times(n-n0)\}$.

Furthermore, a solid-state imaging device according to another aspect of the present invention includes: a semiconductor substrate; pixel cells arranged in rows and columns formed above the semiconductor substrate; column signal lines each of which is provided for a corresponding one of the columns, the pixel cells each including: a reset transistor, a reset transistor, and an amplifier transistor which are formed in the semiconductor substrate; and a photoelectric conversion part, the photoelectric conversion part including: a photoelectric conversion film formed above the semiconductor substrate; a pixel electrode which is formed on one surface of the photoelectric conversion film, the one surface facing the semiconductor substrate; and a transparent electrode which is formed on the other surface of the photoelectric conversion film, the other surface being an opposite surface to the one surface on which the pixel electrode is formed, and the solid-state imaging device further including: a lower-refractive-index transparent layer formed above the transparent electrode; and a plurality of higher-refractive-index transparent parts embedded in the lower-refractive-index transparent layer and each having a planar shape or a columnar shape, wherein each of the higher-refractive-index transparent parts has a cross section which is perpendicular to the semiconductor substrate and has a zigzag central axis bisecting the cross section in width, and light is separated into zero-order diffracted light, first-order diffracted light, and negative-first-order diffracted light as passing through the lower-refractive-index transparent layer and the higher-refractive-index transparent parts.

A cross section of the higher-refractive-index transparent part has widths different between above and below the zigzag of the central axis as illustrated in, for example, FIGS. 5A to 5D. Specifically, the width of the cross section below the zigzag of the central axis is shorter than the width of the cross section above the zigzag of the central axis.

The zero-order diffracted light is detected by a first photoelectric conversion part, the first-order diffracted light is detected by a second photoelectric conversion part, and the negative first-order diffracted light is detected by a third photoelectric conversion part.

Here, $\sin\theta=A/\sqrt{(L^2+A^2)}$ is satisfied where $P/2<A<P\times\sqrt{(5/2)}$. In the equation, L is a distance between the end surface of the higher-refractive-index transparent part facing the semiconductor substrate and a first attenuation point which is in the first photoelectric conversion part and on a normal from the higher-refractive-index transparent part to the first photoelectric conversion part and at which light volume is one-hundredth of the closest point on its surface. Similarly, A is a distance between the first attenuation point and a second attenuation point which is a point in a second photoelectric conversion part adjacent to the first attenuation point and at which light volume is one-hundredth of the closest point on its surface, and θ is an angle of diffraction by the higher-refractive-index transparent part.

Optionally, the solid-state imaging device includes a plurality of light-collecting elements on the light-incident side of the pixel cells. Each of the light-collecting elements has a distribution of effective refractive indices provided by a light transmissive film having a concentric ring structure which is segmented into regions each having a width shorter than or approximately equal to a wavelength of the incident light.

The solid-state imaging device in this configuration has both high resolution and increased sensitivity.

Concrete description of embodiments of the present invention will be given below using the drawings. It should be noted that the description of the embodiments of the present invention using the drawings attached hereto is given for illustrative purposes only, and the present invention is not limited to these embodiments.

Embodiment 1

Figure 1:
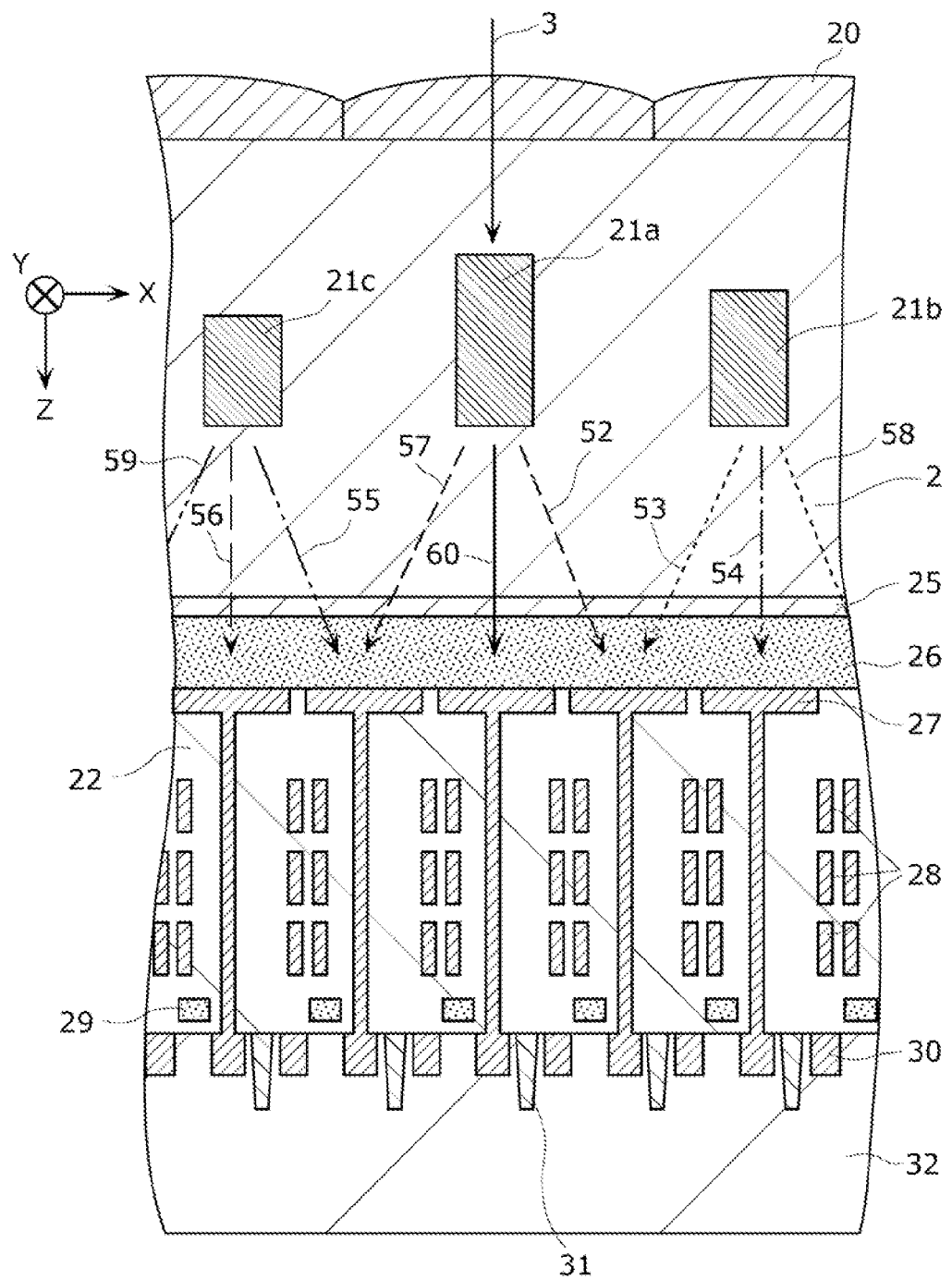
FIG. 1 is a sectional view illustrating a basic structure of a solid-state imaging device according to Embodiment 1 of the present invention.

FIG. 1 is a sectional view illustrating a basic structure of a solid-state imaging device according to Embodiment 1 of the present invention.

The solid-state imaging device is a layered solid-state imaging device in which pixel cells are arranged in a two-dimensional array (that is, in rows and columns) and column signal lines are provided to the respective columns of the pixel cells. Each of the column signal lines vertically (in a columnwise direction) transmits signal voltages output from the pixel cells in the corresponding column. One of the dimensions of the pixel cell is, for example, 1.5 μm.

Each of the pixel cells includes an amplifier transistor, a reset transistor, and an address transistor which are formed in a semiconductor substrate 32 made of silicon, and a photoelectric conversion part. Each of the transistors includes a gate electrode 29, a diffusion layer 30, an isolation region 31, and an LSI wiring 28. The diffusion layer 30 refers to a source diffusion layer, a drain diffusion layer, and a gate diffusion layer (channel diffusion layer). A photoelectric conversion film part converts incident light into electric charges to generate signal charges depending on the amount of incident light, and accumulates the signal charges.

An inter-layer insulating film 22 is provided on the semiconductor substrate 32, covering the transistors. Part of the photoelectric conversion part is formed on the inter-layer insulating film 22. The photoelectric conversion part includes a photoelectric conversion film 26 including amorphous silicon, a pixel electrode 27 formed on the lower surface of the photoelectric conversion film 25 (one surface of the photoelectric conversion film 26 facing the semiconductor substrate 32), and a transparent electrode 25 formed on the upper surface of the photoelectric conversion film 26 (the other surface of the photoelectric conversion film 26 opposite to the one surface facing the semiconductor substrate).

The photoelectric conversion film 26, formed above the semiconductor substrate 32, converts incident light into electric charges. The pixel electrode 27, formed above the semiconductor substrate 32, is in contact with the photoelectric conversion film 26 and collects signal charges generated by the photoelectric conversion film 26. The transparent electrode 25, formed above the semiconductor substrate 32, applies a constant voltage to the photoelectric conversion film 26 so that the signal charges generated by the photoelectric conversion film 26 are read out to the pixel electrode 27. The amplifier transistor, having a gate electrode 29 connected to the pixel electrode 27, outputs a signal voltage depending on potential of the pixel electrode 27. The reset transistor, having a source connected to the pixel electrode 27, resets potential of the photoelectric conversion film part, that is, potential of the gate electrode 29 of the amplifier transistor. The address transistor, provided between the amplifier transistor and the column signal line, selectively causes the pixel cells in a corresponding column to output a signal voltage to the column signal line.

The solid-state imaging device according to Embodiment 1 has a configuration in which pixel circuitry including the address transistor, amplifier transistor, and reset transistor is formed in the semiconductor substrate 32 and the photoelectric conversion film 26 is provided, via the inter-layer insulating film 22, above the semiconductor substrate 32. In the solid-state imaging device in this configuration, the photoelectric conversion film 26 may include a material having a large optical absorption coefficient, such as amorphous silicon. For example, a photoelectric conversion film including amorphous silicon and having a thickness of 0.4 nm absorbs most of green light having a wavelength of 550 nm as it passes therethrough.

Furthermore, unlike typical solid-state imaging devices, the layered solid-state imaging device in the configuration does not include embedded photodiodes. It is therefore possible to configure the photoelectric conversion part of the solid-state imaging device so as to have an increased capacitance so that saturated charge amount can be increased. It is also possible to further increase the capacitance because part of electric charges is not transferred. This allows smaller pixel cells to have a sufficient capacitance and have a structure similar to the structure of a stacked cell in a dynamic random access memory.

Furthermore, soft-resetting is performed on the solid-state imaging device according to the Embodiment 1 in combination with hard-resetting, where the soft resetting temporarily lowers the potential of the reset transistor below ground potential.

Specifically, hard-resetting of the solid-state imaging device according to Embodiment 1 is performed by applying a first reset voltage to the drain of the reset transistor and then changing the reset transistor to an on-state. Soft-resetting is performed by applying a second reset voltage to the drain of the reset transistor and then applying a negative pulse to the source of the reset transistor via a capacitor. The second reset voltage is higher than the first reset voltage. This resetting operation makes it possible to reduce noise to $1/\sqrt{2}$ of noise in the case of only performing hard-resetting, even when the solid-state imaging device has smaller pixel cells.

The solid-state imaging device further includes a lower-refractive-index transparent layer 2 formed above the photoelectric conversion part (transparent electrode 25), microlenses 20, and higher-refractive-index transparent parts 21a, 21b, and 21c. The lower-refractive-index transparent layer 2 includes $SiO_2$.

The higher-refractive-index transparent part 21a, 21b, and 21c, including SiN, have a refractive index higher than the refractive index of the lower-refractive-index transparent layer 2, and are embedded in the lower-refractive-index transparent layer 2. Each of the pixel cells includes a corresponding one of the higher-refractive-index transparent parts 21a, 21b, and 21c (in FIG. 1, a set of three pixel cells). Each of the higher-refractive-index transparent parts 21a, 21b, and 21c separates light passing therethrough into zero-order diffracted light, first-order diffracted light, and negative first-order diffracted light. After exiting the higher-refractive-index transparent part, each of the zero-order diffracted light, first-order diffracted light, and negative first-order diffracted light travels toward the photoelectric conversion film 26 included in a different one of the pixel cells. The higher-refractive-index transparent parts 21a, 21b, and 21c are provided for the microlens 20 on a one-to-one basis and disposed on the central axis of the corresponding microlens 20. The higher-refractive-index transparent parts 21a, 21b, and 21c and lower-refractive-index transparent layer 2 are transparent to visible light.

Each of the higher-refractive-index transparent parts 21a, 21b, and 21c may be a transparent part having a planar shape elongated along the Y axis (perpendicularly to the paper bearing FIG. 1). For example, the transparent part having a planar shape has a main surface perpendicular to the main surface of the semiconductor substrate 32 (photoelectric conversion film 26) and has a thickness dimension along the X axis. In other words, the transparent part has a main surface parallel to the Y-Z plane and a thickness along the widthwise direction. Optionally, the higher-refractive-index transparent parts 21a, 21b, and 21c may be a separate transparent part having a columnar shape and provided for the microlens 20 on a one-to-one basis. For example, the transparent part having a columnar shape has a bottom surface parallel to the main surface of the semiconductor substrate 32 (photoelectric conversion film 26). In other words, the transparent part has a bottom surface parallel to the X-Y plane and a height dimension along the Z axis. Cross sections of the higher-refractive-index transparent parts 21a, 21b, and 21c parallel to the Y axis are identical in shape. When the higher-refractive-index transparent parts 21a, 21b, and 21c have a columnar shape, the dimension of each of the higher-refractive-index transparent parts along the Y axis is twice to three times of its dimension along the X axis. The higher-refractive-index transparent parts 21a, 21b, and 21c are different in width w (dimension along the X axis) and length h (dimension along the Z axis). The higher-refractive-index transparent parts 21a, 21b, and 21c are a dispersive element for red, a dispersive element for green, and a dispersive element for blue, respectively.

For example, the higher-refractive-index transparent part for red 21a has a width via of 0.35 μm and a length ha of 1.8 μm. After entering the higher-refractive-index transparent part for red 21a, light 3 is separated into zero-order diffracted light, negative first-order diffracted light, and first-order diffracted light by the higher-refractive-index transparent part for red 21a when exiting the higher-refractive-index transparent part for red 21a. Then, the zero-order diffracted light, negative first-order diffracted light, and first-order diffracted light are detected by the photoelectric conversion parts. The zero-order diffracted light is light 60 in colors other than red (green and blue, which make cyan). The first-order diffracted light is red light 52. The negative first-order diffracted light is red light 57. Similarly, after entering the higher-refractive-index transparent part for green 21b, light is separated into zero-order diffracted light, first-order diffracted light, and negative first-order diffracted light by the higher-refractiveindex transparent part 21b. The zero-order diffracted light is light 54 in colors other than green (red and blue, which make magenta). The first-order diffracted light is green light 53. The negative first-order diffracted light is green light 58. After entering the higher-refractive-index transparent part for blue 21c, light is separated into zero-order diffracted light, first-order diffracted light, and negative first-order diffracted light by the higher-refractive-index transparent part for blue 21c. The zero-order diffracted light is light 56 in colors other than blue (red and green, which make yellow). The first-order diffracted light is blue light 55. The negative first-order diffracted light is blue light 59.

Figure 2:
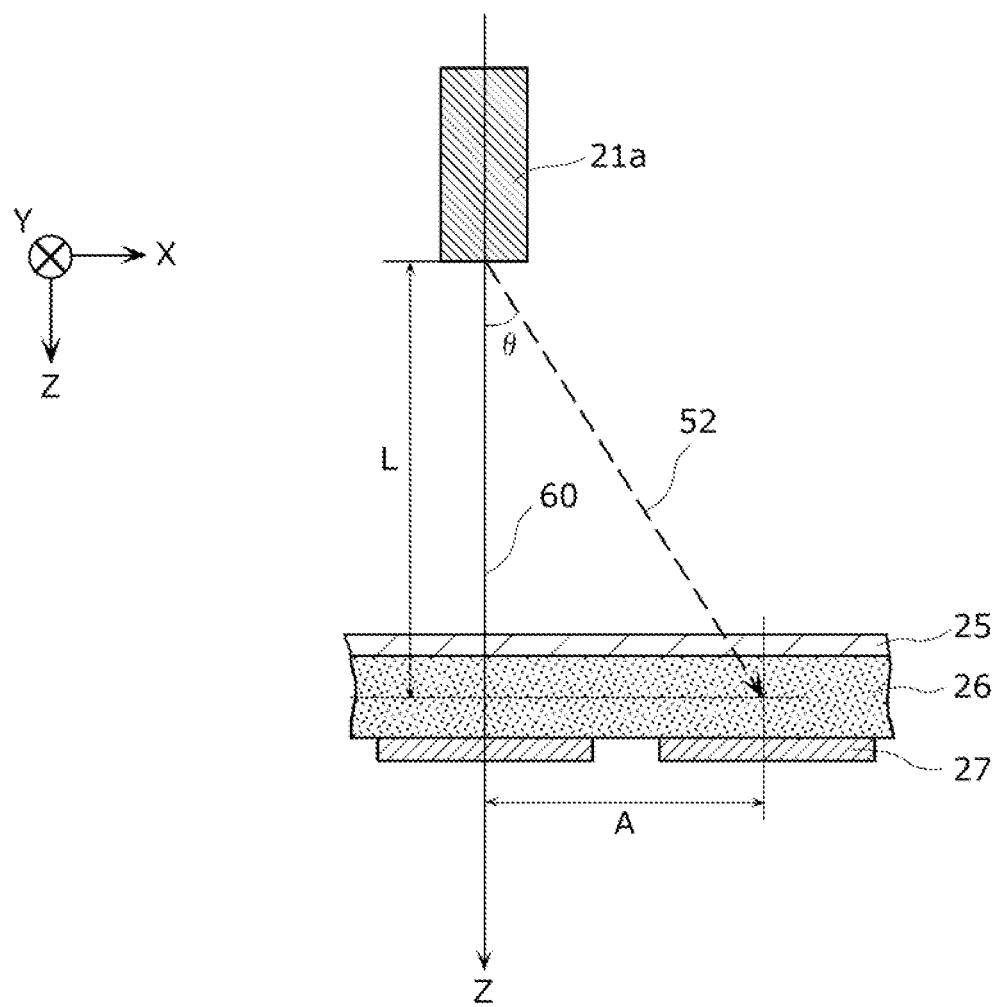
FIG. 2 illustrates relative positions of dispersive elements and a photoelectric conversion part of the solid-state imaging device according to Embodiment 1 of the present invention.

FIG. 2 illustrates positional relationships of the dispersive elements (higher-refractive-index transparent parts 21a, 21b, and 21c) and the photoelectric conversion parts of the solid-state imaging device according to Embodiment 1.

Passing through the higher-refractive-index transparent part 21a, part of light exits the higher-refractive-index transparent part 21a at a diffraction angle θ and then enters the photoelectric conversion part (the transparent electrode 25, photoelectric conversion film 26, and pixel electrode 27). At this time, given a right-angled triangle having a hypotenuse which is a line segment from the light-exiting end surface of the higher-refractive-index transparent part 21a to a position in the photoelectric conversion film 26 where incident light volume is one-hundredth of the incident light volume on the surface of the photoelectric conversion film 26 as illustrated in FIG. 2, the height L and the base A of the right-angled triangle satisfy a condition $\sin\theta = A/\sqrt{(L^2+A^2)}$, where $P/2 < A < P \times \sqrt{(5/2)}$. When the condition is satisfied, the diffracted light enters the photoelectric conversion part without exception. As a result, the solid-state imaging device is free from color mixture and degradation in sensitivity.

In this manner, the solid-state imaging device according to Embodiment 1 separates light into light having different colors not using general pigment-based color filters but using dispersive elements. Such use of the dispersive elements reduces loss in light volume due to absorption in color separation, so that the solid-state imaging device has both high color reproducibility and high sensitivity.

Moreover, a typical solid-state imaging device obtains color information for one color using one microlens. In contrast, the solid-state imaging device according to Embodiment 1 obtains color information for two colors using one microlens. The configuration of the pixel cells according to Embodiment 1 thereby doubles pixel density compared to that of conventional solid-state imaging devices.

For the solid-state imaging device according to Embodiment 1, the phase shift d for the dispersive element for red is set at $1.5\lambda R$, the phase shift d for the dispersive element for green is set at $1.5\lambda G$, and the phase shift d for the dispersive element for blue is set at $1.5\lambda B$, where $\lambda R$ denotes the wavelength of red light, $\lambda G$ denotes the wavelength of green light, and $\lambda B$ denotes the wavelength of blue light. However, this setting is not intended to limit the present invention. The phase shift d may be set at any value such that $d=\lambda \times (\text{integer greater than or equal to zero}+0.5)$, where $\lambda$ represents any of $\lambda R$, $\lambda G$, and $\lambda B$. Therefore, the phase shift d for the higher-refractive-index transparent part for red 21a is set at $\lambda R \times (a+\frac{1}{2})$, the phase shift d for the higher-refractive-index transparent part for green 21b is set at $\lambda G \times (b+\frac{1}{2})$, and the phase shift d for the higher-refractive-index transparent part for blue 21c is set at $\lambda B \times (b+\frac{1}{2})$, where a, b, and c each denote an integer greater than or equal to zero, $\lambda R$ denotes the wavelength of red light, $\lambda G$ denotes the wavelength of green light, and $\lambda B$ denotes the wavelength of blue light.

The present invention is not limited to the solid-state imaging device according to Embodiment 1 in which the three higher-refractive-index transparent parts for red, green, and blue are used for separating visible light into light having complementary colors of the three primary colors of red, green, and blue.

For example, it is also possible to use only two types of higher-refractive-index transparent parts: one is for a first wavelength, and the other for a second wavelength. It is preferable in this case that the higher-refractive-index transparent part for the first wavelength be set to have a thickness h which satisfies $h = \text{the first wavelength} \times (2 \times a + 1)/\{2 \times (n - n0)\}$, and the higher-refractive-index transparent part for the second wavelength be set to have a thickness h which satisfies $h = \text{the second wavelength} \times (2 \times b + 1)/\{2 \times (n - n0)\}$, where $\lambda 1$ denotes the first wavelength (for example, a wavelength of infrared light), $\lambda 2$ denotes the second wavelength (for example, a wavelength of green light), n denotes the refractive index of each of the higher-refractive-index transparent parts, n0 denotes the refractive index of a lower-refractive-index transparent layer surrounding the higher-refractive-index transparent parts, and a and b each denote an integer greater than or equal to zero. The smaller the value of a and b (for example, 0 or 1), the shorter the height of the higher-refractive-index transparent part. Such a shorter higher-refractive-index transparent has less light loss and is possible to manufacture more easily.

In the above description, the higher-refractive-index transparent parts 21a, 21b, and 21c of the solid-state imaging device according to Embodiment 1 have such a shape that the width w is constant along the z-axis as illustrated in FIG. 1. However, the shape of the higher-refractive-index transparent parts 21a, 21b, and 21c is not limited to this. They may have any shape such that an axis bisecting, in width (a dimension parallel to the main surface of the semiconductor substrate 32 (photoelectric conversion film 26)), a cross section perpendicular to the main surface of the semiconductor substrate 32 (photoelectric conversion film 26) is straight and light passing through the higher-refractive-index transparent parts 21a, 21b, and 21c is separated into zero-order diffracted light, negative first-order diffracted light, and first-order diffracted light and exit the higher-refractive-index transparent parts 21a, 21b, and 21c to travel toward the photoelectric conversion film 26.

Figure 3A:
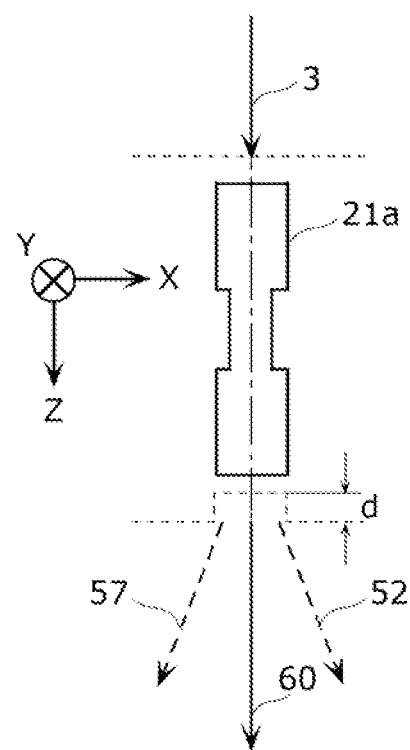
FIG. 3A is a sectional view illustrating a structure of an optical element for complementary color diffraction according to Embodiment 1 of the present invention.
Figure 3B:
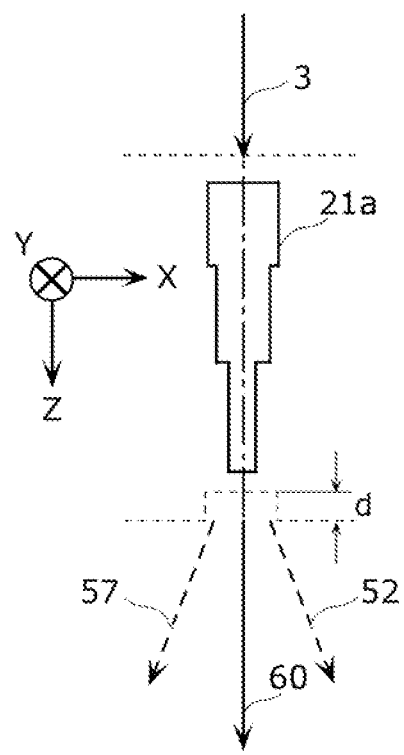
FIG. 3B is a sectional view illustrating a structure of an optical element for complementary color diffraction according to Embodiment 1 of the present invention.
Figure 3C:
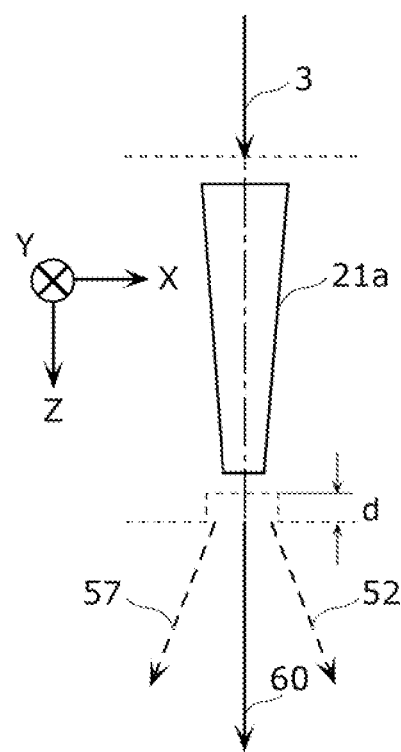
FIG. 3C is a sectional view illustrating a structure of an optical element for complementary color diffraction according to Embodiment 1 of the present invention.
Figure 3D:
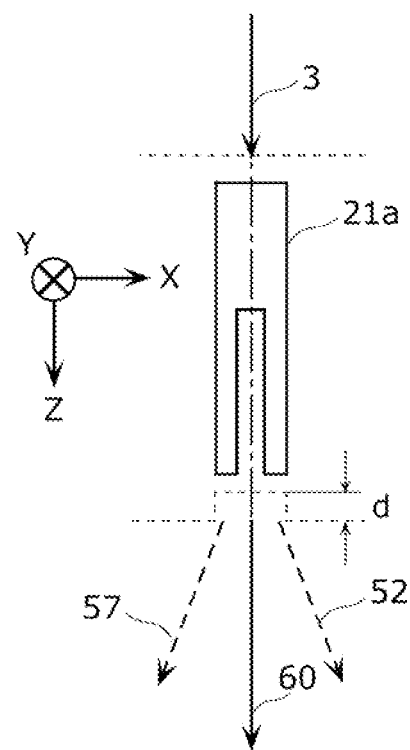
FIG. 3D is a sectional view illustrating a structure of an optical element for complementary color diffraction according to Embodiment 1 of the present invention.
Figure 3E:
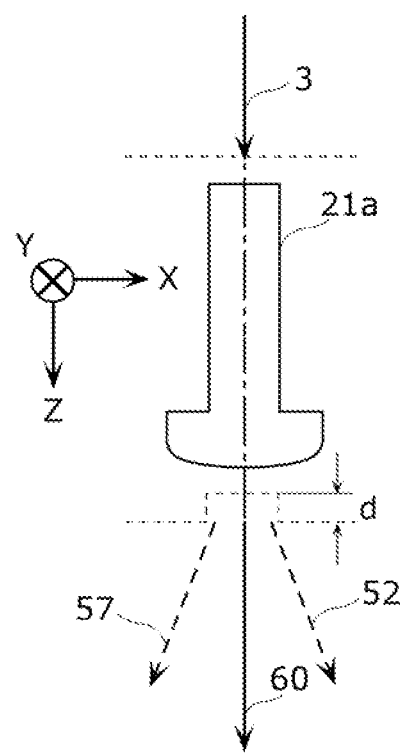
FIG. 3E is a sectional view illustrating a structure of an optical element for complementary color diffraction according to Embodiment 1 of the present invention.
Figure 3F:
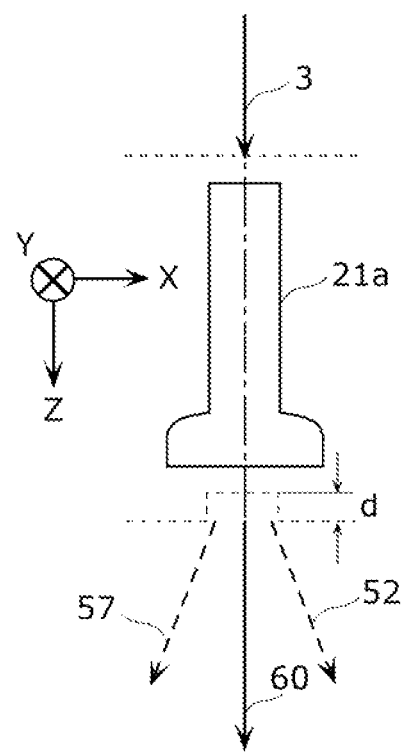
FIG. 3F is a sectional view illustrating a structure of an optical element for complementary color diffraction according to Embodiment 1 of the present invention.

For example, the higher-refractive-index transparent part 21a may have a shape having two different widths as illustrated in FIG. 3A or a step-like shape having three or more different widths narrowing toward its lower end (the end facing the photoelectric conversion part) in the Z-axis direction as illustrated in FIG. 3B. The higher-refractive-index transparent part 21a illustrated in FIG. 3A or FIG. 3B includes a first portion and a second portion having different widths which are dimensions parallel to the main surface of the semiconductor substrate 32 (photoelectric conversion film 62). The first portion is located closer than the second portion to the semiconductor substrate 32, and has the width shorter than the width of the second portion. Optionally, the higher-refractive-index transparent part 21a may have a tapered shape gradually narrowing toward the lower end along the z-axis direction as illustrated in FIG. 3C. Optionally, the higher-refractive-index transparent part 21a may have a forked shape dividing into branches toward the lower end along the z-axis direction as illustrated in FIG. 3D. Optionally, the higher-refractive-index transparent part 21a may have a lenticular shape including a microlens structure at the lower end (the end facing the photoelectric conversion part) along the Z-axis direction as illustrated in FIG. 3E or FIG. 3F.

Alternatively, optical elements for RGB diffraction may be used in the solid-state imaging device according to Embodiment 1 instead of the optical elements for complementary color diffraction.

Embodiment 2

Figure 4:
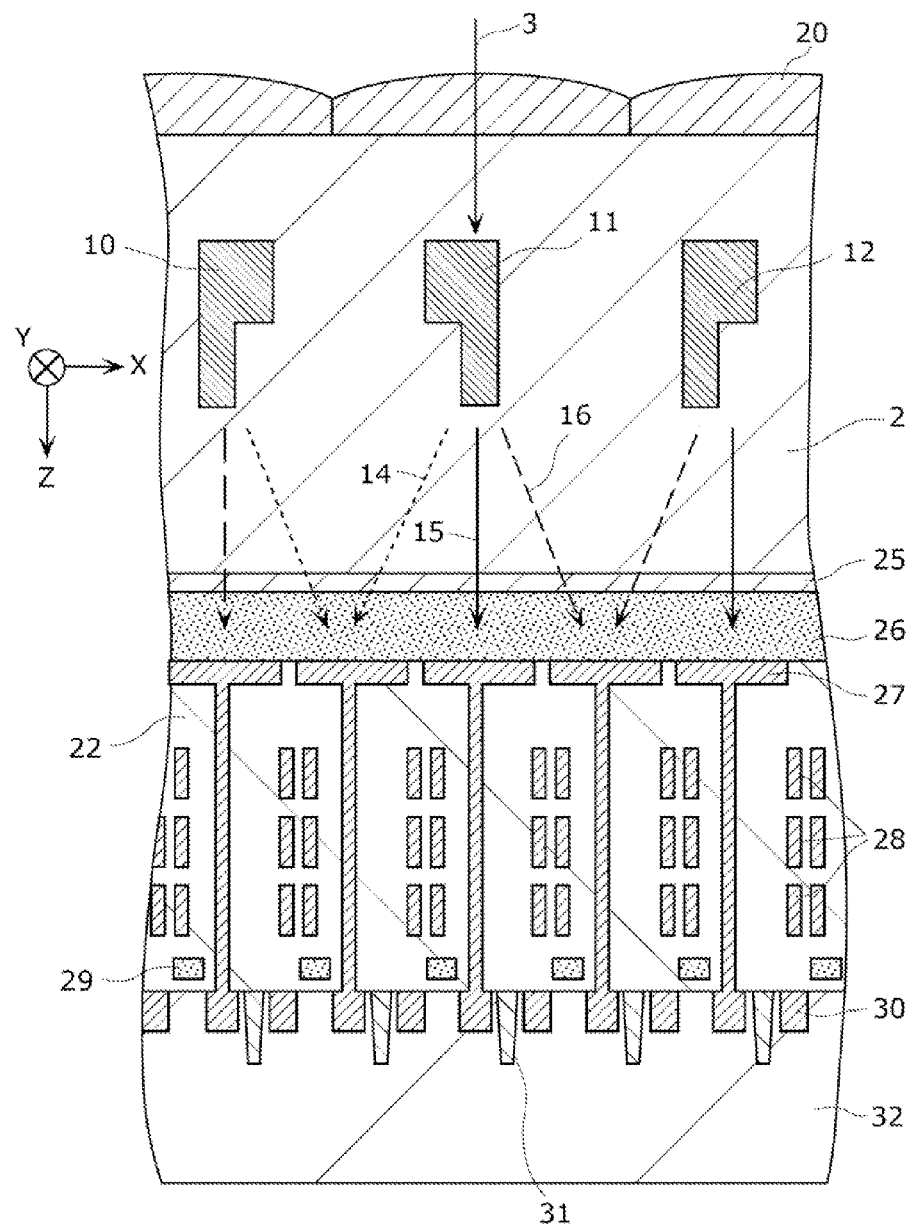
FIG. 4 is a sectional view illustrating a basic structure of a solid-state imaging device according to Embodiment 2 of the present invention.

FIG. 4 is a sectional view illustrating a basic structure of a solid-state imaging device according to Embodiment 2 of the present invention.

The solid-state imaging device is different from the solid-state imaging device according to Embodiment 1 in that the solid-state imaging device according to Embodiment 2 includes optical elements for RGB diffraction and higher-refractive-index transparent parts. Each of the higher-refractive-index transparent parts has a cross section which is perpendicular to the main surface of a semiconductor substrate 32 (or parallel to the X-Z plane) and has a zigzag central axis which bisects the cross section in width. The width is a dimension parallel to the main surface of the semiconductor substrate.

The solid-state imaging device is a layered solid-state imaging device in which pixel cells are arranged in rows and columns and column signal lines are provided to the respective columns of the pixel cells. Each of the column signal lines vertically (in a column-wise direction) transmits signal voltages output from the pixel cells in the corresponding column. One of the dimensions of the pixel cell is, for example, 1.5 μm.

Each of the pixel cells includes an amplifier transistor, a reset transistor, and an address transistor which are formed in a semiconductor substrate 32 made of silicon, and a photoelectric conversion part. Each of the transistors includes a gate electrode 29, a diffusion layer 30, an isolation region 31, and an LSI wiring 28.

An inter-layer insulating film 22 is provided on the semiconductor substrate 32, covering the transistors. Part of the photoelectric conversion part is formed on the inter-layer insulating film 22. The photoelectric conversion part includes a photoelectric conversion film 26 including amorphous silicon, a pixel electrode 27 formed on the lower surface of the photoelectric conversion film 26, and a transparent electrode 25 formed on the upper surface of the photoelectric conversion film 26.

The solid-state imaging device further includes a lower-refractive-index transparent layer 2 formed above the photoelectric conversion part (transparent electrode 25), microlenses 20, and higher-refractive-index transparent parts 10, 11, and 12. The lower-refractive-index transparent layer 2 includes $SiO_2$.

The higher-refractive-index transparent part 10, 11, and 12, including SiN, have a refractive index higher than the refractive index of the lower-refractive-index transparent layer 2, and are embedded in the lower-refractive-index transparent layer 2. Each of the pixel cells includes a corresponding one of the higher-refractive-index transparent parts 10, 11, and 12 (in FIG. 4, a set of three pixel cells). Each of the higher-refractive-index transparent parts 10, 11, and 12 separates light passing therethrough into zero-order diffracted light, first-order diffracted light, and negative first-order diffracted light. After exiting the higher-refractive-index transparent part, each of the zero-order diffracted light, first-order diffracted light, and negative first-order diffracted light travels toward the photoelectric conversion film 26 included in a different one of the pixel cells. The higher-refractive-index transparent parts 10, 11, and 12 and lower-refractive-index transparent layer 2 are transparent to visible light.

Each of the higher-refractive-index transparent parts 10, 11, and 12 may be a transparent part having a planar shape elongated along the Y axis (perpendicularly to the paper bearing FIG. 4). For example, the transparent part having a planar shape has a main surface perpendicular to the main surface of the semiconductor substrate 32 (photoelectric conversion film 26) and has a thickness dimension along the X axis. In other words, the transparent part has a main surface parallel to the Y-Z plane and a thickness along the widthwise direction. Optionally, the higher-refractive-index transparent parts 10, 11, and 12 may be separate transparent part having a columnar shape and provided for the microlens on a one-to-one basis. For example, the transparent part having a columnar shape has a bottom surface parallel to the main surface of the semiconductor substrate 32 (photoelectric conversion film 26). In other words, the transparent part has a bottom surface parallel to the X-Y plane and a height along the Z axis. Cross sections of the higher-refractive-index transparent parts 10, 11, and 12 parallel to the Y axis are identical in shape. When the higher-refractive-index transparent parts 10, 11, and 12 have a columnar shape, the dimension of each of the higher-refractive-index transparent parts along the Y axis is twice to three times of its dimension along the X axis. The higher-refractive-index transparent parts 10, 11, and 12 are provided for the microlens 20 on a one-to-one basis and disposed on the central axis of the corresponding microlens 20. The higher-refractive-index transparent parts 10, 11, and 12 are a dispersive element for green, a dispersive element for blue, and a dispersive element for red, respectively.

After entering the higher-refractive-index transparent part for green 10, light 3 excites a plurality of modes in the higher-refractive-index transparent part for green 10 to localize the electric field. The positions where the electric field is localized depends on wavelength. Light exits the higher-refractive-index transparent part from where final positions of the localized electric field and the exit end overlap each other. Green light exits the higher-refractive-index transparent part from the end surface portion of the higher-refractive-index transparent part for green 10 as a first-order diffracted light 15 along the Z axis direction, and blue light and red light are output from edge portions of the end surface portion as a zero-order diffracted light 14 and a negative first-order diffracted light 16, respectively. As such, after entering the higher-refractive-index transparent part for green 10, light 3 is separated into the first-order diffracted light 15, zero-order diffracted light 14, and negative first-order diffracted light 16. Similarly, after entering the higher-refractive-index transparent part for blue 11 or the higher-refractive-index transparent part for red 12, the light 3 is separated into the first-order diffracted light 15, zero-order diffracted light 14, and negative first-order diffracted light 16.

In this manner, the solid-state imaging device according to Embodiment 1 separates light into light having different colors not using general pigment-based color filters but using dispersive elements. Such use of the dispersive elements reduces loss in light volume due to absorption in color separation, so that the solid-state imaging device has both high color reproducibility and high sensitivity.

Moreover, in the solid-state imaging device according to Embodiment 2, a photoelectric conversion part between neighboring dispersive elements receives light having the same color from the neighboring dispersive elements (for example, red light or blue light). This makes it possible to obtain color information from light having colors which would be absorbed in color filters, so that pixel density can be increased.

The higher-refractive-index transparent parts 10, 11, and 12 of the solid-state imaging device according to Embodiment 2 need not be disposed symmetrically to the Y-Z plane as described above.

Optionally, the higher-refractive-index transparent parts 10, 11, and 12 may be designed so that the pixel cells receive light having a desired wave.

The shape of the higher-refractive-index transparent parts 10, 11, and 12 is not limited to the shape illustrated in FIG. 4. The higher-refractive-index transparent parts 10, 11, and 12 only need to have a zigzag central axis (represented by an alternate long and short dash line) which bisects the cross section parallel to the X-Z plane. In other words, the central axis bisecting the cross section perpendicular to the main surface of a semiconductor substrate 32 (or parallel to the X-Z plane) in width (a dimension parallel to the X axis) is zigzag, extending in the Z-axis direction.

Figure 5A:
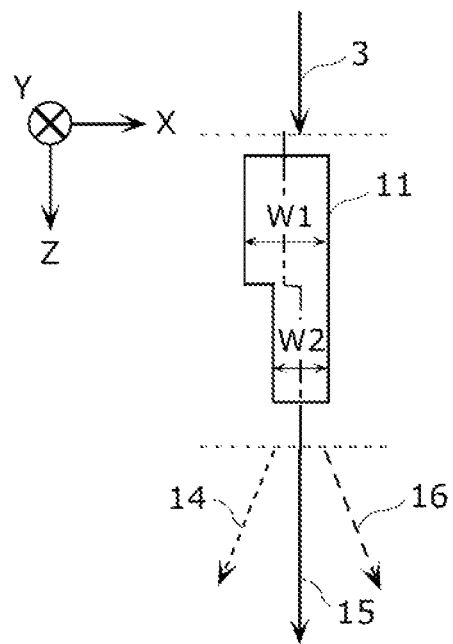
FIG. 5A is a sectional view illustrating a structure of an optical element for RGB diffraction according to Embodiment 2 of the present invention.

For example, referring to FIG. 5A, the higher-refractive-index transparent part 11 of the solid-state imaging device according to Embodiment 1 has two surfaces which determine its widths (dimension in the direction parallel to the main surface of the semiconductor substrate 2) w1 and w2. One of the surfaces (the right face in FIG. 5A) is flat across upper and lower portions of the higher-refractive-index transparent part 11, that is, the portion above the position where the central axis shifts and the portion below the position (that is, across the portion having the width w1 and the portion having the width w2).

Figure 5B:
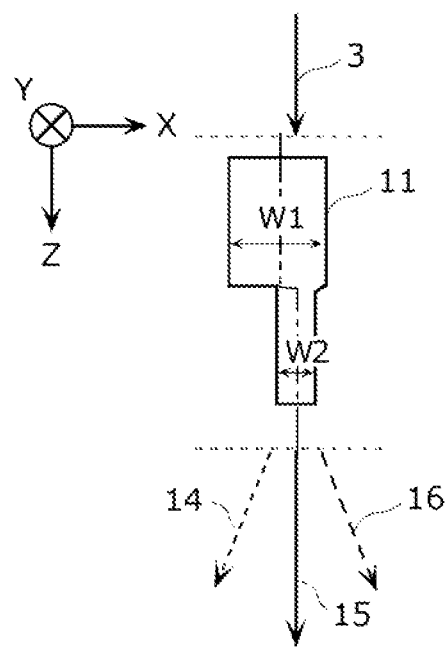
FIG. 5B is a sectional view illustrating a structure of an optical element for RGB diffraction according to Embodiment 2 of the present invention.

Optionally, each the surfaces of the higher-refractive-index transparent part 11 which determine a width w1 in its upper portion and a width w2 in its lower portion may have a step-like profile. Referring to FIG. 5B, one of the surfaces (the right surface in FIG. 5B) has a step-like profile shifting between the upper portion and the lower portion in a direction opposite to the shift of the central axis, and the other (the left surface in FIG. 5B) has a step-like profile shifting between the upper portion and the lower portion in the same direction as the direction of the shift in the central axis.

Figure 5C:
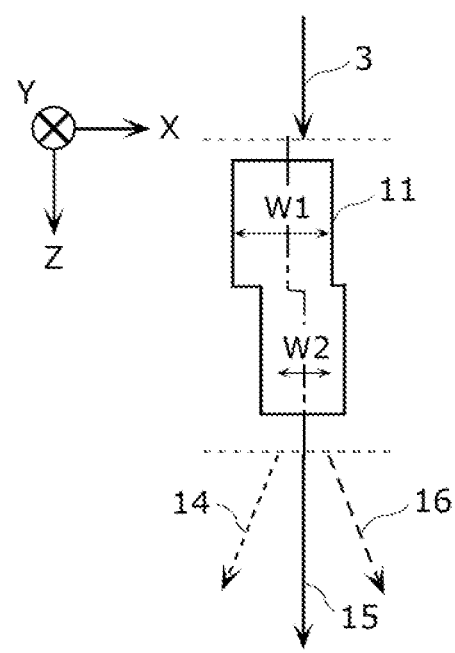
FIG. 5C is a sectional view illustrating a structure of an optical element for RGB diffraction according to Embodiment 2 of the present invention.

Optionally, each of the surfaces of the higher-refractive-index transparent part 11 which determine a width w1 in its upper portion and a width w2 in its lower portion may have right and left surfaces each having a step-like profile shifting between the upper portion and the lower portion in the same direction as the direction of the shift in the central axis as illustrated in FIG. 5C.

Figure 5D:
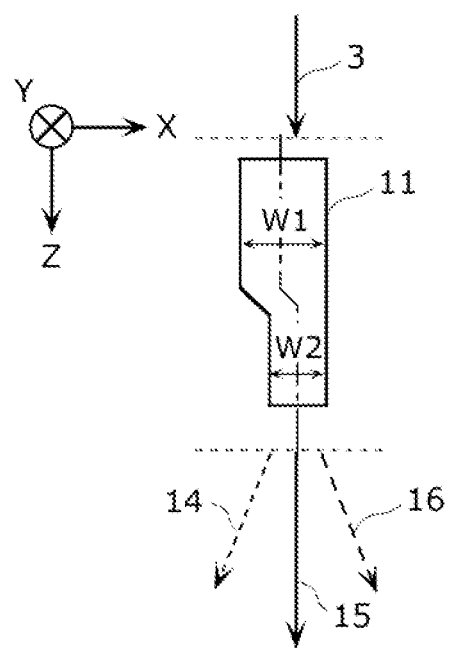
FIG. 5D is a sectional view illustrating a structure of an optical element for RGB diffraction according to Embodiment 2 of the present invention.

Optionally, one of the left and right surfaces (for example, the left surface in FIG. 5D) of the higher-refractive-index transparent part 11 which a width w1 in its upper portion and a width w2 in its lower portion may slope between the upper portion and the lower portion in the same direction as the direction of an oblique shift in the central axis as illustrated in FIG. 5D. In other words, the central axis may gradually shift so that the central axis is oblique to the Z axis over a certain distance along the Z axis.

The width w1, which is the width of the higher-refractive-index transparent part 11 in its upper portion, may be constant or change in the upper portion. Similarly, the width w2, which is the width of the higher-refractive-index transparent part 11 in its lower portion, may be constant or may be constant or change in the lower portion. Optionally, the central axis may have one shift or more.

In this case, the higher-refractive-index transparent part 11 illustrated in FIG. 5A, FIG. 5B, or FIG. 5D includes a first portion and a second portion having different widths w2 and w1, respectively, which are dimensions parallel to the main surface of the semiconductor substrate 32 (or the photoelectric conversion film 26). The first portion is located closer than the second portion to the semiconductor substrate 32. The width w2 of the first portion is shorter than the width w1 of the second portion.

Embodiment 3

Figure 6:
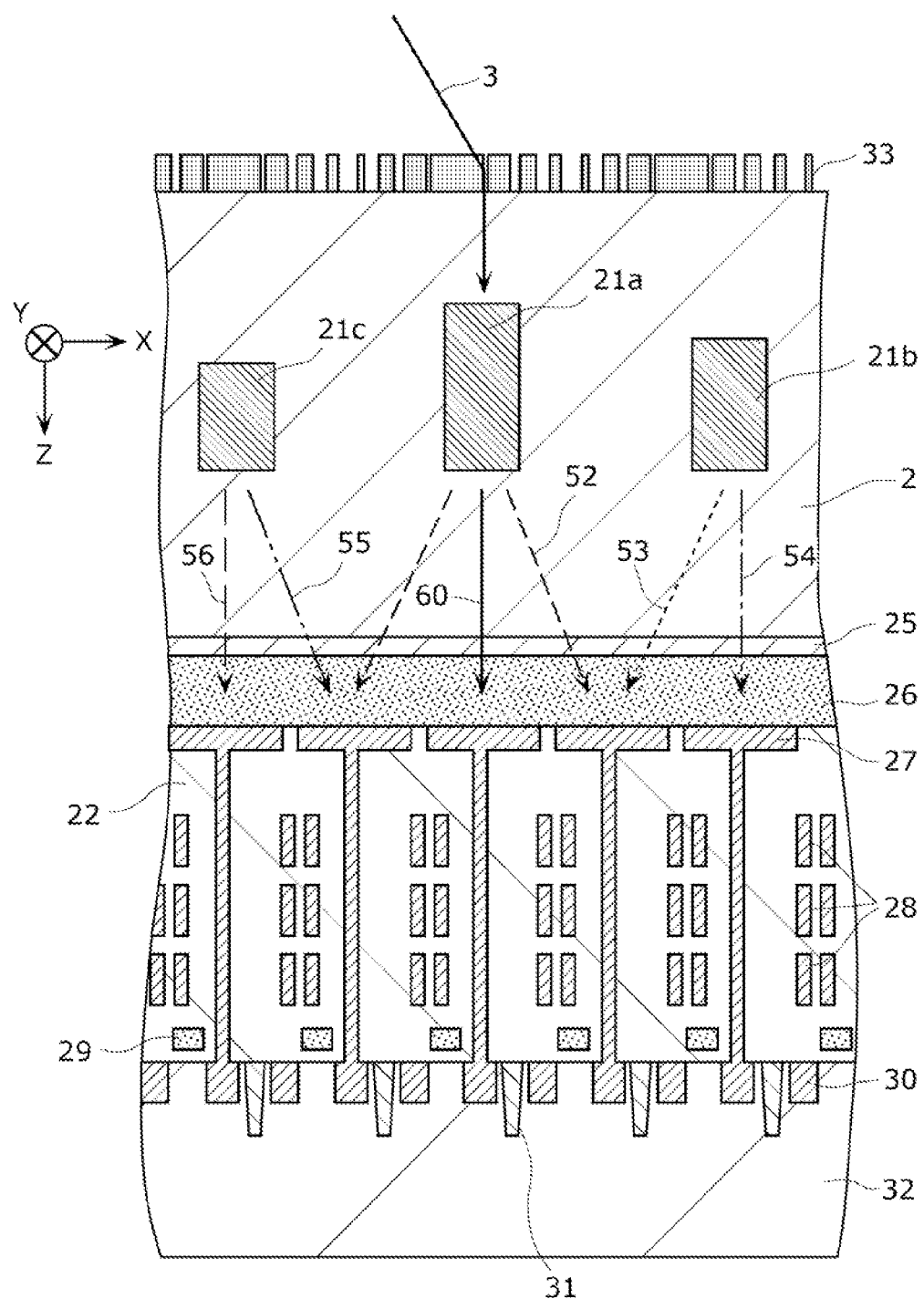
FIG. 6 is a sectional view illustrating a basic structure of a solid-state imaging device according to Embodiment 3 of the present invention.

FIG. 6 is a sectional view illustrating a basic structure of a solid-state imaging device according to Embodiment 3 of the present invention.

The solid-state imaging device includes a plurality of light-collecting elements. The solid-state imaging device according to Embodiment 3 is different from the solid-state imaging device according to Embodiment 1 in that each of the light-collecting elements of the solid-state imaging device according to Embodiment 3 has a distribution of effective refractive indices in a light transmissive film having a concentric ring structure which is segmented into regions each having a width shorter than or approximately equal to a wavelength of the incident light.

The solid-state imaging device is a layered solid-state imaging device in which pixel cells are arranged in rows and columns and column signal lines are provided to the respective columns of the pixel cells. Each of the column signal lines vertically (in a column-wise direction) transmits signal voltages output from the pixel cells in the corresponding column. One of the dimensions of the pixel cell is, for example, 1.5 μm.

Each of the pixel cells includes an amplifier transistor, a reset transistor, and an address transistor which are formed in a semiconductor substrate 32 made of silicon, and a photoelectric conversion part. Each of the transistors includes a gate electrode 29, a diffusion layer 30, an isolation region 31, and an LSI wiring 28.

An inter-layer insulating film 22 is provided on the semiconductor substrate 32, covering the transistors. Part of the photoelectric conversion part is formed on the inter-layer insulating film 22. The photoelectric conversion part includes a photoelectric conversion film 26 including amorphous silicon, a pixel electrode 27 formed on the lower surface of the photoelectric conversion film 26, and a transparent electrode 25 formed on the upper surface of the photoelectric conversion film 26.

The solid-state imaging device further includes a lower-refractive-index transparent layer 2 formed above the photoelectric conversion part (transparent electrode 25), a sub-wavelength structure lenses (subwavelength optical element) 33 serving as light-collecting elements, and higher-refractive-index transparent parts 21a, 21b, and 21c. The lower-refractive-index transparent layer 2 includes $SiO_2$. The subwavelength structure lenses 33 are formed on the lower-refractive-index transparent layer 2, and each have a distribution of effective refractive indices in a light transmissive film having a concentric ring structure segmented into regions each having a width shorter than or approximately equal to a wavelength of the incident light. The higher-refractive-index transparent parts 21a, 21b, and 21c are a dispersive element for red, a dispersive element for green, and a dispersive element for blue, respectively.

Figure 7A:
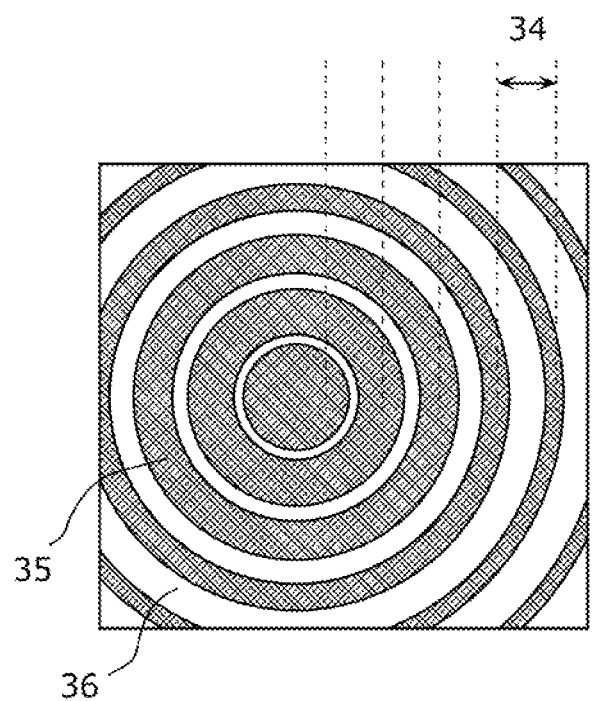
FIG. 7A is a top view of a subwavelength structure lens according to Embodiment 3 of the present invention.

FIG. 7A is a top view of one of the subwavelength structure lenses 33.

As illustrated in FIG. 7A, the subwavelength structure lens 33 is a light transmissive film which is a structure of $SiO_2$ having concentric grooves (or a structure composed of concentric rings of $SiO_2$). The medium surrounding the structure of SiO$_2$ (n=1.43) is air (n=1). In the subwavelength structure lens 33, the rings of SiO$_2$ are close to each other around the center of the pixel cell, and the farther the rings are from the center, the longer the distances between the rings. When the subwavelength structure lens 33 has micro regions 34 each of which includes both a higher-refractive-index material (SiO$_2$) 35 and a lower-refractive-index material (air) 36 and has a width shorter than or approximately equal to the wavelength of incident light, the optical effective refractive index of the subwavelength structure lens 33 is determined by the volume ratio between the two materials in the micro region. In other words, the higher (or lower) the volume ratio of the higher-refractive-index material to the lower-refractive-index material in the micro region 34, the higher (or lower) the effective refractive index is.

The subwavelength structure lenses 33 located at a peripheral area of the solid-state imaging device, are gradient-index lenses having an eccentric optical center shifted to the left from the center of the pixel cell as illustrated in FIG. 6 and FIG. 7A. In this case, after entering the subwavelength structure lens 33 from a direction slanting to the left of the paper bearing FIG. 6, light 3 is diffracted vertically as illustrated in FIG. 6. In other words, after entering at given angles θ, light 3 is collected and diffracted by the subwavelength structure lens 33 and separated by the higher-refractive-index transparent parts 21a, 21b, and 21c, and then travels to the photoelectric conversion part as illustrated in FIG. 6.

In this manner, the solid-state imaging device according to Embodiment 3 separates light into light having different colors not using general pigment-based color filters but using dispersive elements. Such use of the dispersive elements reduces loss in light volume due to absorption in color separation, so that the solid-state imaging device has both high color reproducibility and high sensitivity.

Figure 7B:
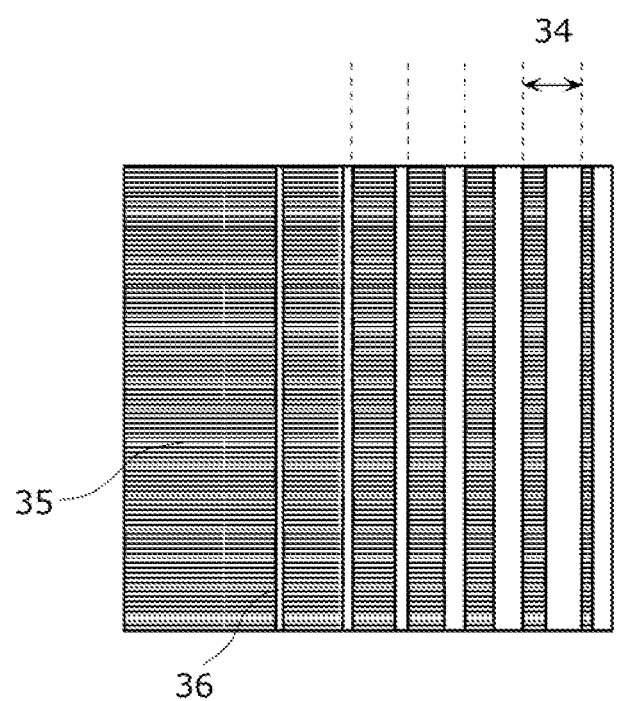
FIG. 7B is a top view of a subwavelength structure lens according to Embodiment 3 of the present invention.

Although the above-described subwavelength optical elements included in the solid-state imaging device is capable of collecting and diffracting light, the solid-state imaging device according to Embodiment 3 may include subwavelength optical elements capable of only diffracting light as illustrated in FIG. 7B. When the subwavelength optical elements are not capable of collecting light, parallel light vertically enters the dispersive elements. This increases diffraction efficiency of the dispersive elements, and thereby color reproducibility increases.

Comparative Example

A description of solid-state imaging devices according to comparative examples of the embodiments of the present invention will be given below using the drawings.

In a typical solid-state imaging device, electrodes and wiring layers are formed on a Si substrate, light from above the Si substrate is separated into, for example, red light, green light, and blue light, by color filters, and the red light, green light, and blue light are converted into electric charges by light-receiving parts. However, the number of stacked wiring layers increases as pixel sizes become smaller, so that the distance between microlenses and the light-receiving parts increases. This reduces the amount of incident light to reach the light-receiving parts, resulting in significant degradation of sensitivity.

General pigment-based color filters transmit light having specific wavelengths and absorb light having the other wavelengths. As a result, approximately 60% of a incident signal is lost.

To improve the situation, the solid-state imaging device according to the present invention includes small diffractive dispersive elements which separate light passing therethrough into zero-order diffracted light, first-order diffracted light, and negative first-order diffracted light without causing loss in light volume due to absorption. The present invention is therefore expected to produce a significant increase in sensitivity and allow further miniaturization of pixel cells.

The following describes the basic structure of the dispersive elements and the principle of generation of diffracted light using FIG. 5A to FIG. 8D.

Figure 8A:
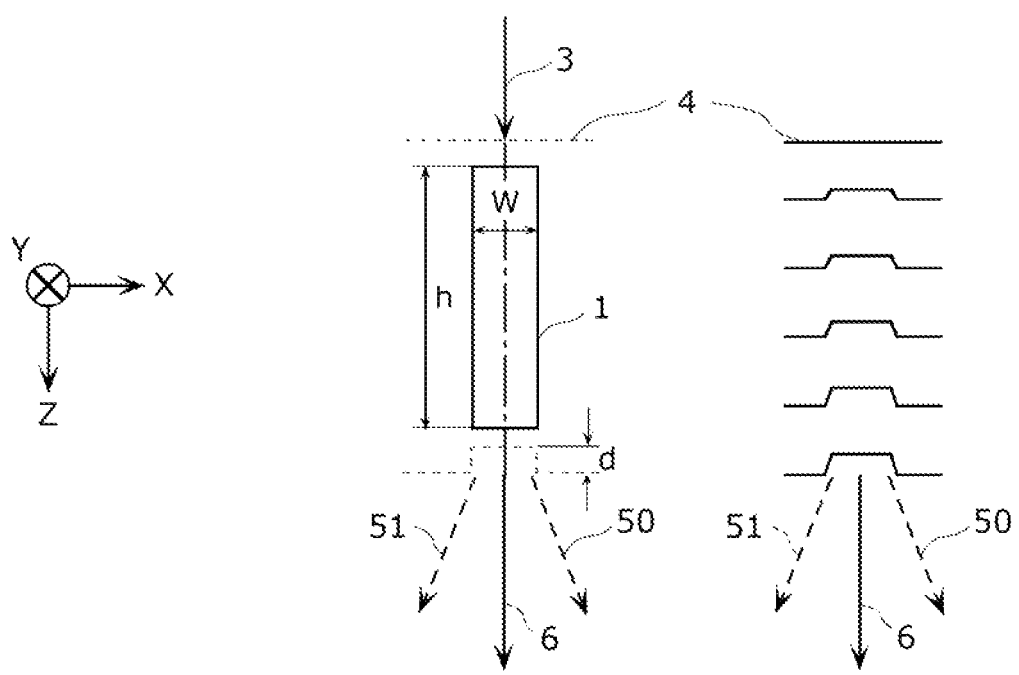
FIG. 8A is a sectional view of a dispersive element according to a comparative example of the embodiments of the present invention.

FIG. 8A is a sectional view of a dispersive element (optical element) which performs complementary color diffraction utilizing a phase shift. In FIG. 8A, the alternate long and short dash line represents the central axis which bisects, in width which is a dimension along the X-axis direction, a cross section of the dispersive element along a X-Z plane.

A higher-refractive-index transparent part 1, which is the dispersive element, is a transparent part which has a planar shape having a width (dimension along the X axis) w and a length (dimension along the Z axis) h and elongated along the Y axis (in the direction perpendicular to the paper bearing FIG. 5A). The refractive index of the higher-refractive-index transparent part 1 is represented by n, and the refractive index of a lower-refractive-index transparent layer surrounding the higher-refractive-index transparent part 1 is represented by n0. It is assumed that light 3 entering the higher-refractive-index transparent part 1 is a plane wave having a planar wave front 4. After the light 3 passes through the higher-refractive-index transparent part 1 and the lower-refractive-index transparent layer, the wave front 4 has a phase shift d in the portion which has passed through the higher-refractive-index transparent part 1. The phase shift d is represented by an expression d=h(n−n0) (adjusted to length in vacuum). The phase shift causes light diffraction and separation of the light into zero-order diffracted light 6, first-order diffracted light 50, and negative first-order diffracted light 51.

For example, a phase shift as long as approximately a half of a wavelength of blue light strongly causes first-order diffraction of blue light so that blue light can be extracted. In this case, when the incident light is white light, the resulting zero-order diffracted light 6 is yellow light.

Figure 8B:
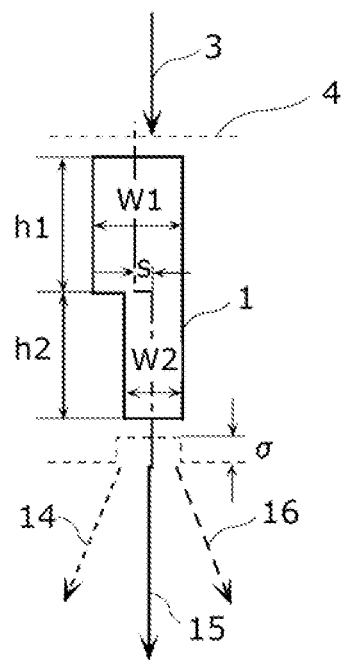
FIG. 8B is a sectional view of the dispersive element according to the comparative example of the embodiments of the present invention.
Figure 8C:
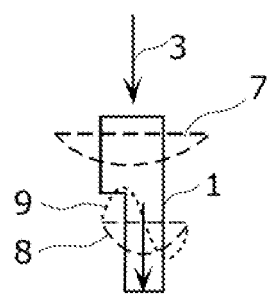
FIG. 8C is a sectional view of the dispersive element according to the comparative example of the embodiments of the present invention.

FIG. 8B is a sectional view of a dispersive element (optical element) which performs RGB diffraction utilizing a phase shift. In FIG. 8B, the alternate long and short dash line represents the central axis which bisects, in width which is a dimension along the X-axis direction, a cross section of the dispersive element along a X-Z plane, and the amount of a shift in the central axis is represented by s.

A higher-refractive-index transparent part 1, which is the dispersive element, is a transparent part which has a planar shape having a width w1 and a width w2 and a length h1 and a length h2 and elongated along the Y axis. The refractive index of the higher-refractive-index transparent part 1 is represented by n, and the refractive index of a lower-refractive-index transparent layer surrounding the higher-refractive-index transparent part 1 is represented by n0. It is assumed that light 3 entering the higher-refractive-index transparent part 1 is a plane wave having a planar wave front 4. After the light 3 passes through the higher-refractive-index transparent part 1 and the lower-refractive-index transparent layer, the wave front 4 has a phase shift σ in the portion which has passed through the higher-refractive-index transparent part 1. The phase shift σ is represented by an expression σ=h2(n−n0) (adjusted to the length in vacuum). The phase shift causes light diffraction and separation of the light into zero-order diffracted light 14, first-order diffracted light 15, and negative first-order diffracted light 16.

Figure 8D:
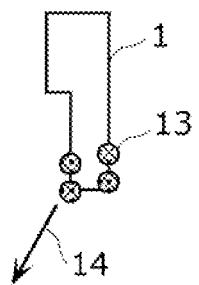
FIG. 8D is a sectional view of the dispersive element according to the comparative example of the embodiments of the present invention.
Figure 8E:
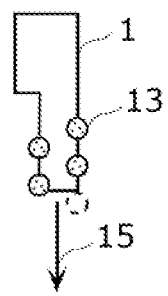
FIG. 8E is a sectional view of the dispersive element according to the comparative example of the embodiments of the present invention.
Figure 8F:
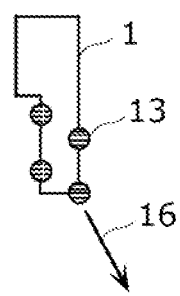
FIG. 8F is a sectional view of the dispersive element according to the comparative example of the embodiments of the present invention.

The following describes the principle of color separation in terms of wave optics using FIG. 8C to FIG. 8F. Incident light 3 excites a zero-order waveguide mode 7 propagating in the higher-refractive-index transparent part 1. The propagation of the zero-order waveguide mode is disturbed when passing through a point where the surface of the higher-refractive-index transparent part 1 has a corner, so that light in a zero-order waveguide mode 8, a first-order waveguide mode 9, a higher-order waveguide-mode light, and a radiation-mode are generated. Mixing of the modes in a waveguide localizes the electric field. Light having different wavelengths is localized at different spots 13. Light exits the higher-refractive-index transparent part 1 in the direction of propagation from a point where the localization spot and an exit end intersect. For example, blue light exits the a higher-refractive-index transparent part for blue (dispersive element for blue) 1 from edge portions of the dispersive element as zero-order diffracted light 14 as illustrated in FIG. 8D. Red light exits the higher-refractive-index transparent part for red (dispersive element for red) 1 from edge portions of the dispersive element as a negative first-order diffracted light 16 as illustrated in FIG. 8F. Green light exits the higher-refractive-index transparent part for green (dispersive element for green) 1 from edge portions of the dispersive element as a first-order diffracted light 15 as illustrated in FIG. 8E.

As described above, both optical elements for complementary color diffraction and optical elements for RGB diffraction have no light loss due to absorption, so that incident light can be efficiently utilized in principle. However, there are two problems with use of the dispersive elements in a solid-state imaging device.

FIG. 9 shows sectional views of a camera system including a solid-state imaging device according to the present comparative example. (a) in FIG. 9 is a sectional view illustrating the structure of the camera system, (b) is a sectional view illustrating the structure of the central portion of the solid-state imaging device, and (c) is a sectional view illustrating a peripheral portion of the solid-state imaging device.

The solid-state imaging device includes pixel cells 18, an optical module including a camera lens 17 and microlenses 20, and dispersive elements. One of the dimensions of the pixel cell 18 is, for example, 1.4 μm. After exiting the camera lens 17 included in the optical module, light 3 vertically enters the pixel cell 18 in the central portion of the solid-state imaging device, but enters the pixel cell 18 in the peripheral portion at a high angle.

As illustrated in (b) in FIG. 9, the dispersive element in the pixel cell 18 in the central portion diffracts the light which has vertically entered the pixel cell 18. Zero-order diffracted light travels straight ahead and is converted into electric charges by the light-receiving part 24. On the other hand, first-order diffracted light is blocked by lines 23, so that the first-order diffracted light cannot reach the light-receiving part 24. This significantly lowers sensitivity. Such blocking of light by the line 23 can be avoided when the distance between the dispersive element and the line 23 is long enough. However, the diffracted light is diffused while traveling a long distance because the diffracted light does not converge. As a result, the light cannot reach the light-receiving part 24. In contrast, in the solid-state imaging device illustrated in FIG. 1, light traveling from the dispersive element toward the light-receiving part is not blocked by such lines because the light-receiving part is located above the lines in the layered solid-state imaging device.

Referring to (c) in FIG. 9, the dispersive element in the pixel cell 18 in the peripheral portion cannot generate a phase shift sufficient for diffraction because of the high incident angle. As a result, efficiency of diffraction of a desired color is almost 0%, which significantly degrades the dispersing function of the dispersive element. Furthermore, sensitivity is also significantly degraded because most of the incident light is reflected or scattered. In contrast, in the solid-state imaging device illustrated in FIG. 7A, pixel cells in its peripheral portion each has a gradient-index lens having an eccentric optical center shifted to the left from the center of the pixel cell, so that increase in the incident angle of light is small even in the peripheral portion and degradation of the dispersing function is reduced.

The present invention is not limited to the embodiments in which the solid-state imaging devices according to the present invention has been described. The present invention also includes variations of the embodiment conceived by those skilled in the art unless they depart from the spirit and scope of the present invention. The present invention also includes a different embodiment where the components in the embodiments above are used in any combination unless they depart from the spirit and scope of the present invention.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present invention is applicable to solid-state imaging devices and products including image sensors, such as digital video cameras, digital still cameras, camera-equipped mobile phones, surveillance cameras, in-car cameras, and broadcast cameras.

The invention claimed is:
1. A solid-state imaging device comprising:
pixel cells arranged in rows and columns; and
column signal lines each of which is provided for a corresponding one of the columns and transmits signal voltages of the pixel cells in the corresponding column,
the pixel cells each including:
a photoelectric conversion film which is formed above a semiconductor substrate and converts incident light into electric charges;
a pixel electrode which is formed on one surface of the photoelectric conversion film and is in contact with the photoelectric conversion film, the one surface facing the semiconductor substrate;
a transparent electrode which is formed on the other surface of the photoelectric conversion film and applies a constant voltage to the photoelectric conversion film, the other surface being an opposite surface to the one surface facing the semiconductor substrate;
an amplifier transistor which is a transistor formed in the semiconductor substrate, has a gate electrode connected to the pixel electrode, and outputs a signal voltage depending on a potential of the pixel electrode;
a reset transistor which is a transistor formed in the semiconductor substrate and resets a potential of the gate electrode of the amplifier transistor; and
an address transistor which is a transistor formed in the semiconductor substrate, is provided between the amplifier transistor and the column signal line, and causes the pixel cell to output the signal voltage to the column signal line, and the solid-state imaging device further comprising:
a lower-refractive-index transparent layer formed above the transparent electrode; and
a plurality of higher-refractive-index transparent parts embedded in the lower-refractive-index transparent layer and each having a refractive index higher than a refractive index of the lower-refractive-index transparent layer,
wherein each of the higher-refractive-index transparent parts separates light passing through the higher-refractive-index transparent part into zero-order diffracted light, first-order diffracted light, and negative-first-order diffracted light which exit the higher-refractive-index transparent part and travel toward the photoelectric conversion film.

2. The solid-state imaging device according to claim 1,
wherein each of the higher-refractive-index transparent parts is a transparent part which has a planar shape having a main surface perpendicular to a main surface of the semiconductor substrate or a transparent part which has a columnar shape having a bottom surface parallel to the main surface of the semiconductor substrate.

3. The solid-state imaging device according to claim 2,
wherein each of the pixel cells includes a corresponding one of the higher-refractive-index transparent parts.

4. The solid-state imaging device according to claim 3,
wherein each of the higher-refractive-index transparent parts has a cross section having a zigzag central axis which bisects the cross section in width, the cross section perpendicular to the main surface of the semiconductor substrate, and the width being a dimension parallel to the main surface of the semiconductor substrate.

5. The solid-state imaging device according to claim 4,
wherein the higher-refractive-index transparent part includes a first portion and a second portion having different widths which are dimensions parallel to the main surface of the semiconductor substrate, and
the first portion is located closer than the second portion to the semiconductor substrate, and has the width shorter than the width of the second portion.

6. The solid-state imaging device according to claim 5,
wherein each of the zero-order diffracted light, first-order diffracted light, and negative-first-order diffracted light exits the higher-refractive-index transparent part and travels toward the photoelectric conversion film included in different one of the pixel cells.

7. The solid-state imaging device according to claim 6, further comprising
a plurality of light-collecting elements formed on the lower-refractive-index transparent layer,
wherein each of the light-collecting elements has a distribution of effective refractive indices in a light transmissive film having a concentric ring structure which is segmented into regions each having a width shorter than or approximately equal to a wavelength of the incident light.

8. The solid-state imaging device according to claim 1,
each of the pixel cells includes a corresponding one of the higher-refractive-index transparent parts.

9. The solid-state imaging device according to claim 1,
wherein each of the higher-refractive-index transparent parts has a cross section having a zigzag central axis which bisects the cross section in width, the cross section perpendicular to the main surface of the semiconductor substrate, and the width being a dimension parallel to the main surface of the semiconductor substrate.

10. The solid-state imaging device according to claim 1,
wherein the higher-refractive-index transparent part includes a first portion and a second portion having different widths which are dimensions parallel to the main surface of the semiconductor substrate, and
the first portion is located closer than the second portion to the semiconductor substrate, and has the width shorter than the width of the second portion.

11. The solid-state imaging device according to claim 1,
wherein each of the zero-order diffracted light, first-order diffracted light, and negative-first-order diffracted light exits the higher-refractive-index transparent part and travels toward the photoelectric conversion film included in different one of the pixel cells.

12. The solid-state imaging device according to claim 1, further comprising
a plurality of light-collecting elements formed on the lower-refractive-index transparent layer,
wherein each of the light-collecting elements has a distribution of effective refractive indices in a light transmissive film having a concentric ring structure which is segmented into regions each having a width shorter than or approximately equal to a wavelength of the incident light.

* * * * *